(12) United States Patent
Hudson et al.

(10) Patent No.: US 6,780,569 B1
(45) Date of Patent: Aug. 24, 2004

(54) POST-DEVELOPMENT TREATMENT OF PATTERNED PHOTORESIST TO PROMOTE CROSS-LINKING OF POLYMER CHAINS

(75) Inventors: Eric Hudson, Berkeley, CA (US); Reza Sadjadi, Saratoga, CA (US); Daxing Ren, Fremont, CA (US); Wan-Lin Chen, Sunnyvale, CA (US); Douglas Keil, Fremont, CA (US); Peter Cirigliano, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 130 days.

(21) Appl. No.: 10/068,282

(22) Filed: Feb. 4, 2002

(51) Int. Cl.[7] .................................................. G03F 7/00
(52) U.S. Cl. ..................... 430/313; 430/311; 430/330
(58) Field of Search ............................ 430/311, 313, 430/315, 330

(56) References Cited

U.S. PATENT DOCUMENTS 5,217,851 A * 6/1993 Kishimura et al. ......... 430/325
5,925,494 A * 7/1999 Horn ...................... 430/270.1

OTHER PUBLICATIONS

Pavlinec, *Cross–Linking of Poly(methyl methacrylate) by Aminolysis of Ester Functions with Diamines*, Journal of Applied Polymer Science, vol. 55 (1996) pp. 39–45.

Kudo, *CD Changes Of 193 nm Resists During SEM Measurement*, Advances in Resist Technology and Processing XVIII, Proceedings SPIE vol. 4345 (2001), pp. 179–189.

Stern, *Electron–Beam Curing of Polymeric Composites as an Enabling Technology for Advanced Manufacturing*, www.ebeamservices.com, (1999) 8 pages.

* cited by examiner

*Primary Examiner*—Kathleen Duda
(74) *Attorney, Agent, or Firm*—Beyer Weaver & Thomas, LLP

(57) ABSTRACT

A method for creating semiconductor devices is provided. A photoresist layer is provided on a wafer. The photoresist layer is patterned. Polymers in the patterned photoresist layer are chemically cross-linked by exposure to at least one reactive chemical. The pattern in the photoresist layer is transferred to the wafer. A reaction chamber for processing a wafer with a patterned layer of photoresist material, wherein the photoresist material was patterned by exposing the photoresist material using light of a wavelength less than 248 nm is provided. A chamber is provided with a central cavity. A wafer support for supporting the wafer in the central cavity is provided. A cross-linking reactive chemical source in fluid contact with the chamber and which provides a reactive chemical which causes cross-linking of the photoresist is provided.

18 Claims, 5 Drawing Sheets

POST-DEVELOPMENT TREATMENT OF PATTERNED PHOTORESIST TO PROMOTE CROSS-LINKING OF POLYMER CHAINS

BACKGROUND OF THE INVENTION

The present invention relates to photoresist patterning. More particularly, the present invention relates to strengthening a photoresist pattern against damage.

Photolithography for patterning photoresist is widely used in the production of semiconductor devices. Presently, 248 nm lithography, using a Krypton Fluoride (KrF) light source, and higher wavelength lithography are very common. It is desirable to perform photolithography with light of a wavelength less than 248 nm to allow a reduction in the design rule to create smaller semiconductor devices. 193 nm lithography using an Argon Fluoride (ArF) light source may be desirable to obtain 0.1 µm to 0.07 µm sizes. 157 nm lithography using a Fluorine ($F_2$) light source may also be desirable.

Chemically amplified positive resists are a type of photoresist that may be used. Amplified positive resists may comprise a polymer with a functional group combined with a separate photoacid generator molecule. Upon exposure to a certain light, the photoacid generator creates a weak acid, which diffuses in the polymer material. After the exposure, photoresist material may be baked, which may cause the acid to attack certain cleavable groups, which deprotects those groups and leaves carboxylic acid in their place. The photoresist layer is then developed by a solvent in a wet bath, which binds to the carboxylic acid, which makes polymers with carboxylic acid groups soluble in the solvent while polymers without the carboxylic acid groups are insoluble in the solvent.

For photoresist materials used for 248 nm and higher wavelength lithography, cross-linking of the photoresist polymer material is typically induced by exposure to deep UV radiation. This method of cross-linking is not effective for photoresist material used in 193 nm and lower wavelength lithography, because these materials are designed to only weakly absorb deep UV radiation. Generally, 193 nm and lower wavelength lithography photoresist material may require the absence of double-bonded carbon and aromatic carbon groups in the polymer. These functional groups have traditionally been used as sites which can be activated to induce cross-linking in photoresist, in some cases by exposure to deep UV radiation, to improve etch and ion implantation resistance. It is believed the absence of these functional groups in 193 nm and lower wavelength photoresist materials, reduces the possibilities for cross-linking these polymers, for example when exposed to deep UV radiation.

Current chemically amplified photoresist material developed for use with 193 nm and lower wavelength lithography may be adversely affected by plasma etching or ion implantation. Exposure of a 193 nm or lower wavelength photoresist film to an etch plasma may lead to a roughening of the film surface and a resulting degradation of the pattern quality. Striations in the walls of trenches and vias, an increase or decrease in critical dimensions, distortion of feature shapes, and pinhole etching of dielectric beneath photoresist film may be some of the undesirable outcomes of this degradation. The release of functional groups during plasma processing may occur from the bulk of the photoresist layer, which may significantly modify the plasma and may affect the etch chemistry. The release of these functional groups may also cause some of the above-described roughening of the film. Photoresists designed for 193 nm and lower wavelength lithography may also be etched at higher rates, compared to established photoresist materials.

The 193 nm and lower wavelength lithography photoresist film may also be degraded during the ion implantation process, due to direct interaction of ions or heating of the photoresist film. Typical high-throughput conditions for ion implantation result in significant wafer heating, which may cause thermally induced reticulation or roughening of the photoresist film and degradation of the photoresist pattern quality. Degradation of the photoresist pattern quality during implantation can lead to several undesirable outcomes, including poor CD (critical dimension) control of the implanted region, reduction in the absolute dosage, and modification of the ion depth profile.

For 193 nm photoresists, electron-beam conditioning has been used in an attempt to improve etch performance, It is believed that this electron-beam conditioning may cleave functional groups of the polymer making the photoresist, which may make a more stable photoresist layer but may also lead to significant shrinkage of the film as these functional groups exit the photoresist film as small molecules. Although the removal of these groups may reduce the subsequent reactivity of the film under plasma conditions, the shrinkage can lead to undesirable and poorly controlled shifts in the critical dimension of features. In addition, it is believed that this electron-beam conditioning may cause chain scission, which could degrade the overall strength of the material and act as an undesirable side-effect of the conditioning. In addition, it is believed that, although electron-beam conditioning may reduce subsequent photoresist damage, the control of the electron-beam induced changes in critical dimensions may not be repeatable enough to provide consistency for a large scale production of semiconductor devices. In addition, electron beam conditioning may require subjecting a wafer to a process that may not be part of a normal chip fabrication process and that may require an unusually long period of time, which may require the use of additional equipment not normally used in a chip fabrication process and a longer processing time.

In view of the foregoing, it is desirable to provide a photoresist film for 193 nm and lower wavelength lithography that is more resistant to damage caused by plasma etching and ion implantation, is less susceptible to shrinkage, and is etched at a reduced rate.

SUMMARY OF THE INVENTION

To achieve the foregoing and in accordance with the purpose of the present invention a method for creating semiconductor devices is provided. A photoresist layer is provided on a wafer. The photoresist layer is patterned. Polymers in the patterned photoresist layer are chemically cross-linked by exposure to at least one reactive chemical. The pattern in the photoresist layer is transferred to the wafer.

In another embodiment of the invention, a method for creating semiconductor devices is provided. A photoresist layer on a wafer is provided. The photoresist layer is patterned comprising exposing regions of the photoresist layer with a light with a wavelength no greater than 193 nm, and removing regions of the photoresist layer. Polymers in the patterned photoresist layer are cross-linked. The pattern in the photoresist layer is transferred to the wafer.

In another embodiment of the invention, a method for creating semiconductor devices is provided. A photoresist layer on a wafer is provided. The photoresist layer is patterned, comprising exposing regions of the photoresist layer with a light with a wavelength no greater than 193 nm, and removing regions of the photoresist layer. The wafer is heated. Polymers in the patterned photoresist layer are chemically cross-linked by exposing the patterned photoresist layer to a reactive gas. The pattern in the photoresist layer is etched into the wafer.

In another embodiment of the invention, a semiconductor device is created. A photoresist layer is provided on a wafer. The photoresist layer is patterned. Polymers in the patterned photoresist layer are chemically cross-linked by exposure to at least one reactive chemical. The pattern in the photoresist layer is transferred to the wafer.

In another embodiment of the invention, a reaction chamber for processing a wafer with a patterned layer of photoresist material, wherein the photoresist material was patterned by exposing the photoresist material using light of a wavelength less than 248 nm is provided. A chamber is provided with a central cavity. A wafer support for supporting the wafer in the central cavity is provided. A cross-linking reactive chemical source in fluid contact with the chamber and which provides a reactive chemical which causes cross-linking of the photoresist is provided.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
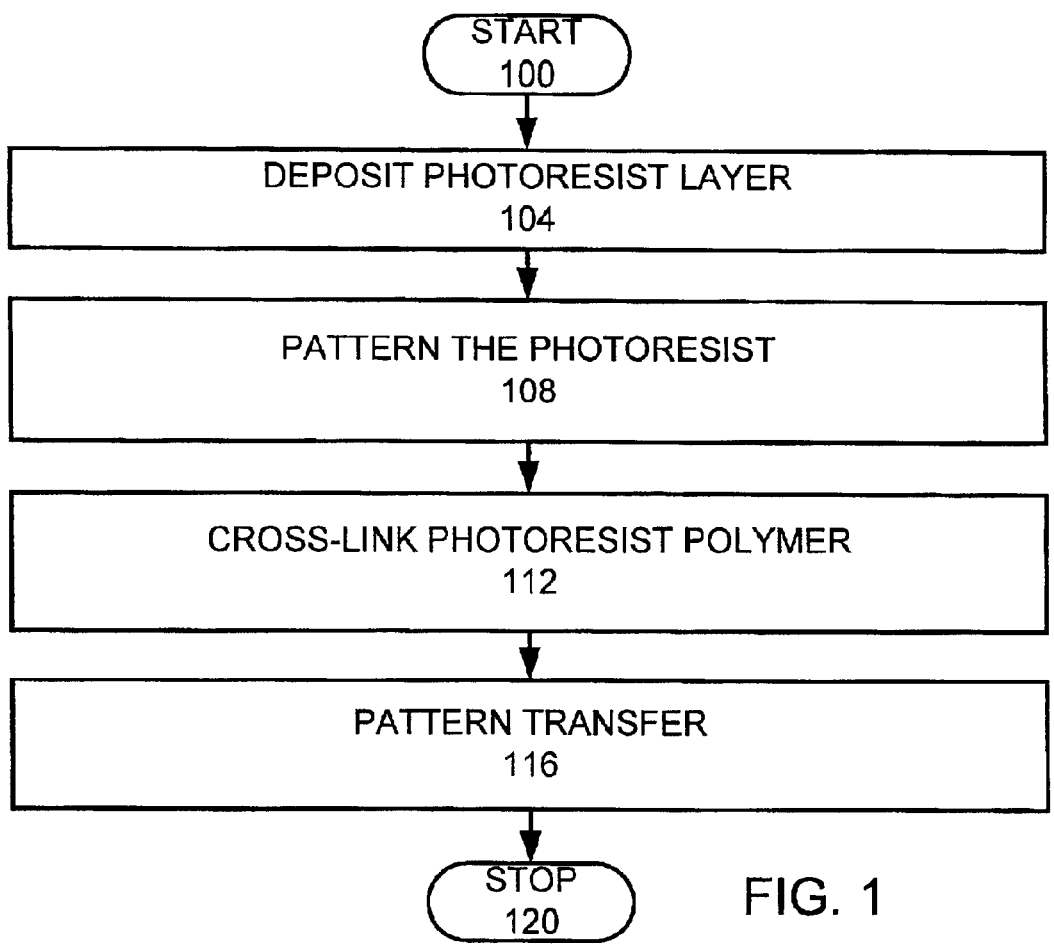
FIG. 1 is a flow chart of an inventive process.

To facilitate understanding, FIG. 1 is a flow chart of a process used in an embodiment of the invention. A photoresist layer is deposited on a wafer (step 104). The wafer is a substrate which may have additional layers used in the manufacture of semiconductor devices, such as integrated circuits and flat panel displays. Preferably, the photoresist layer is of a photoresist material designed for use with light of a wavelength less than 248 nm, such as 193 nm or 157 nm. The copolymer of 2-methyl-2-adamantyl-methacrylate with mevalonic lactone methacrylate (poly(MAdMA-co-MLMA)),is an example of a class of photoresist materials based upon derivatives of poly(methyl methacrylate) PMMA which may be used as chemically amplified 193 nm positive resist when combined with an appropriate photoacid generator. This photoresist is disclosed in: "CD Changes Of 193 nm Resists During SEM Measurement" Takanori Kudo, Jun-Bom Bae, Ralph R. Dammel, Woo-Kyu Kim, Douglas McKenzie, M. Dalil Rahman, Munirathna Padmanaban, and Waiman Ng in Advances in Resist Technology and Processing XVIII, Proceedings SPIE Vol. 4345, pp179–189 (2001). The photoresist layer is then patterned (step 108) using photolithography. Photolithography uses the steps of exposing the photoresist layer to a light, which for this embodiment has a wavelength of 193 nm, which may be produced by an Argon Fluoride (ArF) light source, such as a laser or flashlamp, where a light pattern creates regions that are exposed to the light and regions that are not exposed to the light. The photoresist film is baked to promote the deprotection reaction, and then developed. Since in this example the photoresist film is poly(MAdMA-co-MLMA), the regions exposed by the light are removed during developing. Such developing may use a solvent wet bath to remove the photoresist in the areas exposed by the light.

The resulting patterned photoresist is then subjected to a cross-link step (step 112), where photoresist polymer is cross-linked. Since deep UV exposure is not as effective as for providing cross-linking for these photoresists, preferably exposure to reactive chemicals is used to provide the cross-linking through a reactive chemical cross-linking process.

The wafer is then subjected to a pattern transfer step (step 116). During this step, the patterned photoresist is used as a template to transfer a pattern onto wafer films or the wafer substrate. Such a pattern transfer may be accomplished by etching areas of the wafer exposed by the patterned photoresist or by implanting ions in areas of the wafer exposed by the patterned photoresist. Therefore, for etching, the pattern of the photoresist is etched into films on the wafer. For ion implantation, the pattern of the photoresist is implanted into films on the wafer or into the wafer substrate.

Figure 2:
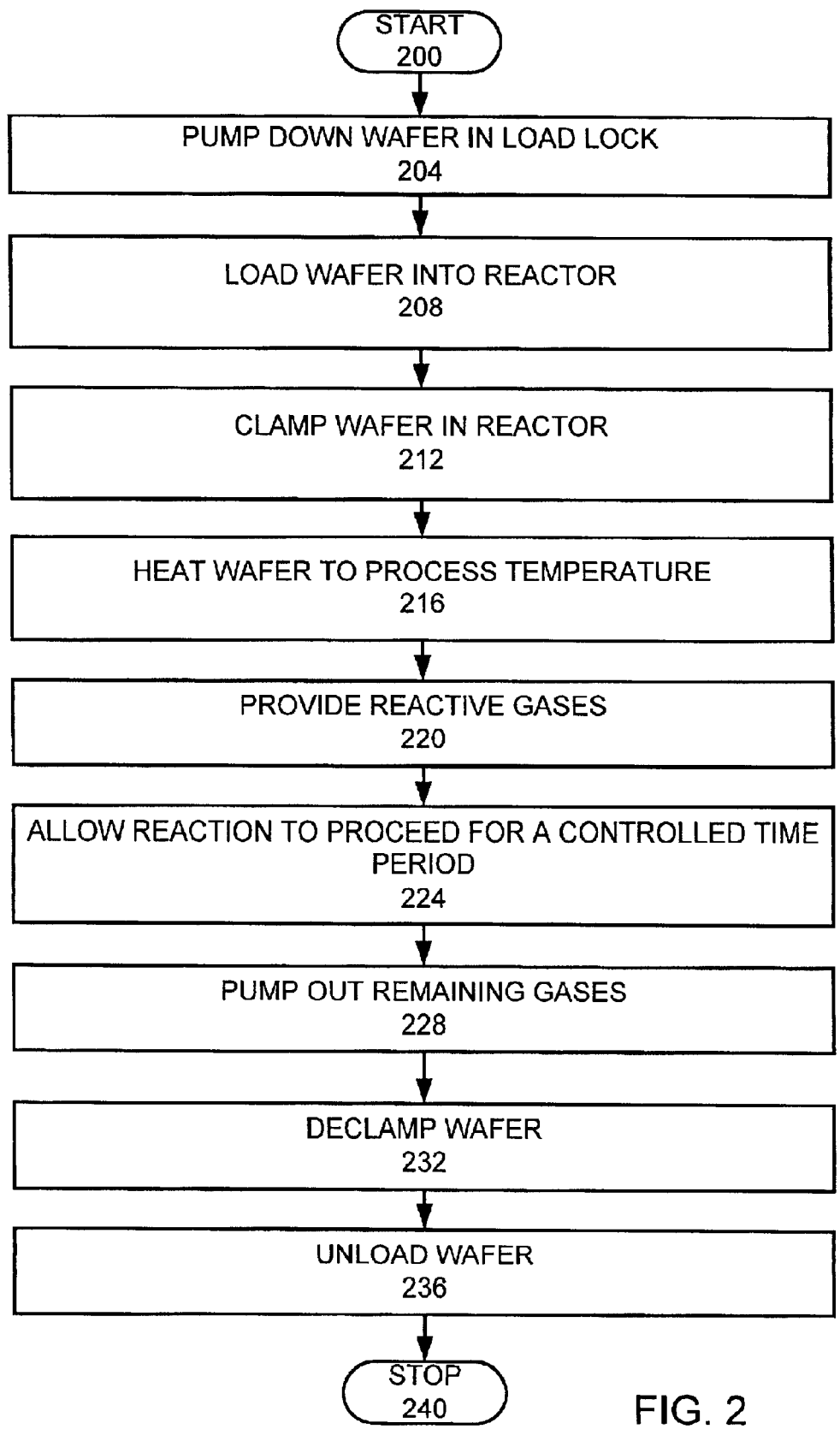
FIG. 2 is a detailed flow chart of a step in the inventive process.
Figure 3:
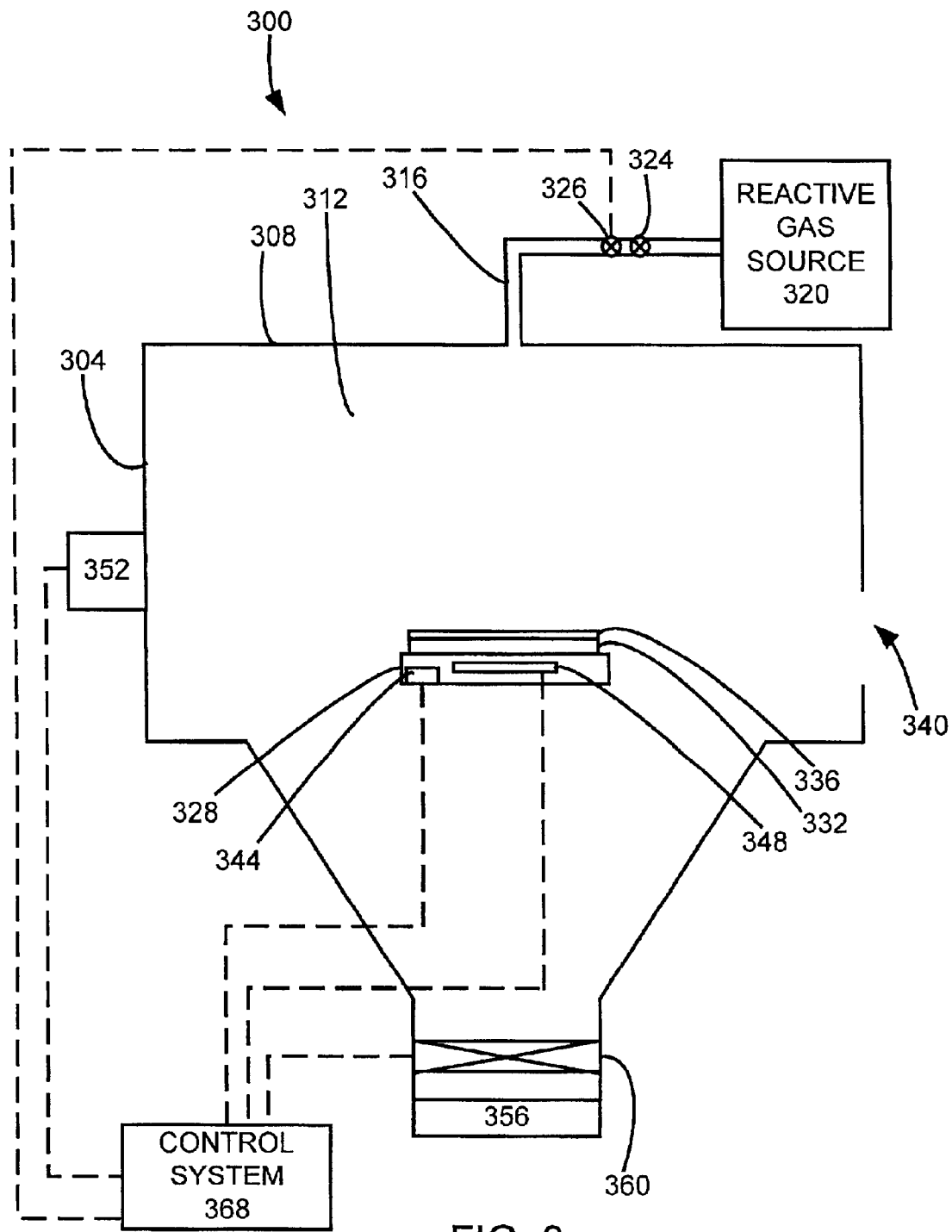
FIG. 3 is a schematic view of reaction chamber.

FIG. 2 is a flow chart of a preferred embodiment of the cross-linking step (step 112). A wafer may be placed in a vacuum load lock chamber. The load lock chamber is then pumped down (step 204). After the load lock chamber has been pumped down, the wafer may be transferred to and loaded in a reaction chamber (step 208). FIG. 3 is a schematic view of a reaction chamber 300, used for an embodiment of the invention. The reaction chamber 300 comprises a chamber wall 304 and a top 308 defining a cavity 312. A gas inlet pipe 316 is disposed between at least one reactive gas source 320 and the cavity 312. A pressure regulator 324 and gas flow controller 326 are placed along the inlet pipe 316. A wafer support 328 supports a wafer 332 with a patterned photoresist layer 336 within the cavity. A port 340 allows the wafer 332 to be loaded from a vacuum load lock to the wafer support 328. A thermocouple 344 and a heater 348 are thermally connected to the wafer support 328, such that the temperature of the wafer support 328 may be controlled by the control system 368. A manometer 352 is coupled to the cavity 312. A vacuum pump 356 is also coupled to the cavity 312 through a pressure control valve 360. A control system 368 reads measurements from and sends control set points to the sensors and controllers, which include manometer 352, thermocouple 344, gas flow controller 326, pressure control valve 360,and heater 348.

The wafer is clamped in the reactor (step 212). In the preferred embodiment, the wafer support 328 is an electrostatic chuck, which is used to clamp the wafer 332. Helium gas is introduced underneath the wafer at a controlled pressure to promote heat transfer from the wafer support 328 to the wafer 332. The wafer 332 is then heated to a process temperature (step 216). In the preferred embodiment, the wafer support 328 is preheated to the desired process temperature and the wafer rapidly achieves this temperature. Reactive gas is then provided into the reaction chamber cavity 312 (step 220) to expose the patterned photoresist layer 336 of the wafer 332 to the reactive gas. Preferably, the reactive gas has a molecular structure which incorporates a reactive group at each end of a chain. The reaction is allowed to proceed for a controlled time period (step 224). During this step, each end of a reactive gas molecule may react and bond with a different polymer chain of the patterned photoresist layer 336, creating a cross-link structure between two polymer chains. The aggregate effect of this treatment is the cross-linking of the polymer chains within the patterned photoresist layer 336. The manometer 352 may be used to determine the pressure in the reaction chamber cavity 312. The control system 368 may send a signal to the pressure control valve 360 to regulate the pressure.

In one embodiment of the invention, the reactive gas continuously flows through the chamber cavity 312 during this step. Reactive gas is continuously provided by the reactive gas source 320. Excess reactive gas and gaseous byproducts of reactions with the patterned photoresist layer 336 are continuously removed by the vacuum pump 356. In another embodiment, a stagnation mode is used, where the reactive gas back fills the chamber cavity 312 to a desired pressure, with the pressure control valve 360 completely closed, and then the flow is stopped for a controlled time period (step 224). In either case, the flow and pressure may be controlled.

In the case of continuously flowing reactive gas, when the time period has passed, the flow regulator 324 stops the flow of the reactive gas and the control system 368 fully opens the pressure control valve 360 to allow the vacuum pump 356 to pump out remaining reactive gas and gaseous byproducts (step 228). In the case of the stagnation mode, when the time period has passed, the control system 368 fully opens the pressure control valve 360 to allow the vacuum pump 356 to pump out remaining reactive gas and gaseous byproducts (step 228). The wafer 332 is then declamped (step 232) and then unloaded from the reaction chamber 300 (step 236). The wafer may be unloaded through the port 340.

The reaction chamber may be one module of a cluster of process modules used in an etching or ion implantation system. In the alternative, the reaction chamber may be part of a photolithography system or may be a stand alone chamber. An etching reaction chamber may be modified to perform the reactive gas cross-linking by providing a wafer heating device in the etching reaction chamber and by providing a system to deliver the reactive gas. An ion implantation reaction chamber may be modified to perform the reactive gas cross-linking by providing a wafer heating device in the ion implantation reaction chamber and by providing a system to deliver the reactive gas. An oven for baking the wafer after a wet bath may also be modified to perform the reactive gas cross-linking by providing a system to deliver the reactive gas. The reaction chamber may be one module of a post-exposure track system. If the resulting improved patterned photoresist layer is air or moisture sensitive, it is desirable to have the reaction chamber provided so that the wafer is not exposed to air between the cross-linking process and the etching or ion implantation process (pattern transferring). This may be done by the above examples of placing the reaction chamber as a module in a cluster of process modules used in an etching or ion implantation system, such that transport between process modules occurs under vacuum.

Any photoresist material may be used to produce the patterned photoresist layer which is to be cross-linked. Preferably, the photoresist material is photoresist material that is exposed by light that has a wavelength of less than 248 nm. Most preferably, the photoresist material is a photoresist material that is exposed by light that has a wavelength no greater than 193 nm, such as poly(MAdMA-co-MLMA) or another PMMA-based polymer.

Examples

An example of this process is where poly(MAdMA-co-MLMA) is the photoresist and ethylene diamine is the reactive gas. During the heating of the wafer to the process temperature step (step 216), the process temperature is preferably between 20° C. and 160° C. More preferably, the process temperature is between 120° C. and 150° C. Most preferably, the process temperature is between 130° C. and 135° C. The pressure in the reaction chamber is at a base pressure before the reactive gas is provided to the chamber. The base pressure is preferably $10^{-6}$ to $10^{-1}$ Torr. The base pressure is more preferably $10^{-5}$ to $10^{-3}$ Torr. The base pressure is most preferably between $10^{-5}$ to $10^{-4}$ Torr. The low base pressure ensures a low density of impurity gases, such as water vapor, and thereby provides control over the conditions of reactive gas exposure. During the step of allowing the reaction to proceed for a time (step 224) when a stagnant reactive gas is used the pressure is preferably between $10^{-2}$ to 50 Torr. The pressure is more preferably between $10^{-1}$ to 20 Torr. The pressure is most preferably between 1–10 Torr. During the step of allowing the reaction to proceed for a time (step 224) when a flow of reactive gas is used the pressure is preferably between $10^{-4}$ to 50 Torr. More preferably, the pressure is between $10^{-3}$ to 20 Torr. Most preferably, the pressure is between $10^{-2}$ to 10 torr.

Figure 4:
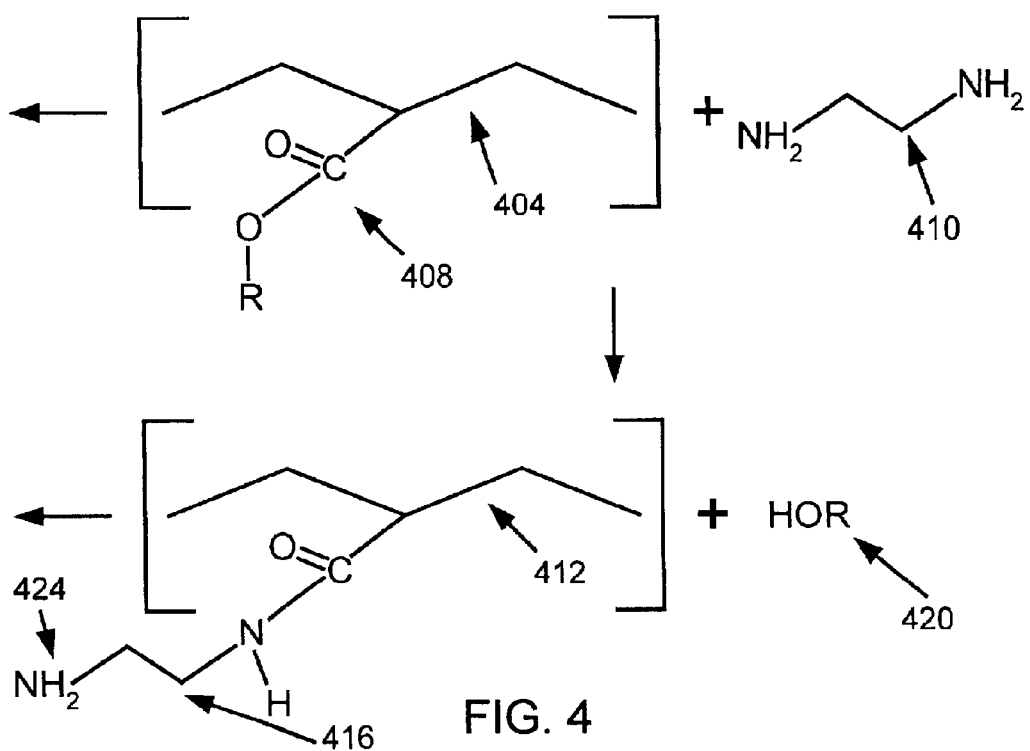
FIG. 4 is a schematic illustration of a chemical reaction in an embodiment of the invention.

Without being bound by theory, FIG. 4 illustrates how it is believed that a reactive ethylene diamine gas would act to cross-ink a photoresist material based upon a PMMA derivative such as poly(MAdMA-co-MLMA). The PMMA-based photoresist layer material comprises a polymer 404 with a cleavable ester group 408. Ethylene diamine 410 is a two-carbon chain with an amine group attached at each end. Through nucleophilic substitution, one of the amnines cleaves the ester group and attaches the ethylene diamine to a polymer chain through an amide group, as shown in FIG. 4. The resulting product is the polymer chain 412 bonded to the ethylene diamine 416 to form a modified polymer chain and an alcohol molecule 420. The unreacted amine group 424 is able to cleave another ester group and bond to another site on a polymer chain. If the second ester group is bound to a different polymer chain than the first ester group, the ethylene diamine has formed a cross-link between two photoresist polymer chains.

Figure 5:
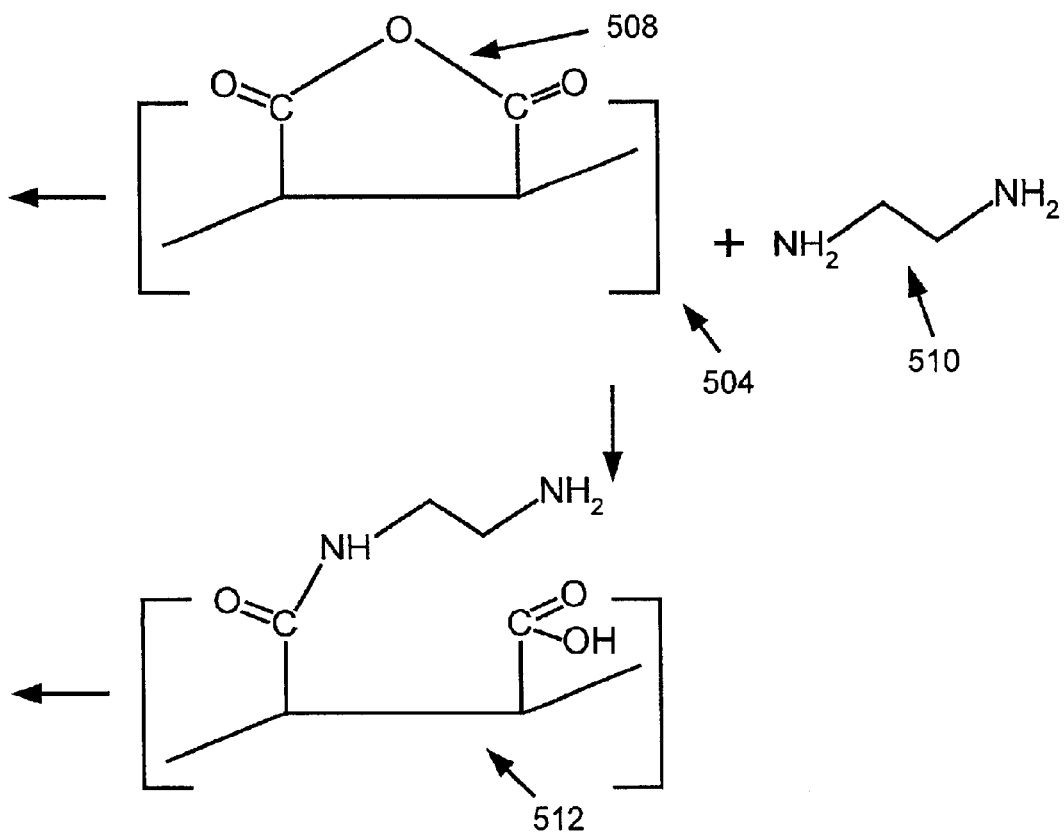
FIG. 5 is a schematic illustration of another chemical reaction in another embodiment of the invention.

In another example, the photoresist material is of the class Cycloolefin Maleic Anhydride (COMA). An example of this is the co-polymer poly(BNC/HNC/NC/MA) formed from these monomers: t-butyl-5-norbornene-2-carboxylate (BNC), 5-norbornene-2-carboxylic acid (NC), 2-hydroxyethyl-5-norbornene-2-carboxylate (HNC), and maleic anhydride (MA). This photoresist is also disclosed in: "CD Changes Of 193 nm Resists During SEM Measurement" Takanori Kudo, Jun-Bom Bae, Ralph R. Dammel, Woo-Kyu Kim, Douglas McKenzie, M. Dalil Rahlman, Munirathna Padmanaban, and Waiman Ng in Advances in Resist Technology and Processing XVIII, Proceedings SPIE Vol. 4345, pp179–189 (2001), which is incorporated by reference. Without being bound by theory, FIG. 5 illustrates how it is believed that a reactive diamine gas would act to cross-link a COMA-derivative photoresist layer. A COMA-type polymer 504 has a maleic anhydride group 508, which is used to strengthen the backbone of the polymer. The reactive diamine 510 gas bonds to a carbon of the maleic anhydride in a polymer chain, as shown in FIG. 5, resulting in the product polymer 512. The unbonded amine of the resulting complex is able to bond with a second polymer chain, creating a cross-link between the two polymer chains. COMA-type polymers may also have ester groups which may be cleaved and joined with the diamine gas, as described in the previous example.

It may be found that the inventive use of reactive chemicals to cause cross-linking in photoresist may be useful in 248 nm or longer wavelength photolithography. In another embodiment, the chemical cross-linking may be provided by exposing a reactive chemical in liquid solution to the photoresist layer. Such a liquid treatment may be provided by a wet bath after the steps of providing a wet bath for developing and providing the photoresist pattern but before a baking step to remove liquid residue. In another embodiment, the chemical cross-linking may be provided by exposing a reactive chemical dissolved in a supercritical fluid to the photoresist layer. In the specification and claims chemically cross-linking polymers (or chemical cross-linking) is defined as cross-linking the photoresist polymers by exposing the polymers to at least one reactive chemical, which may be the reactive gas, reactive chemical in a liquid solution, or by a reactive chemical in a supercritical fluid as has been described above. In other embodiments, the invention may be used to chemically cross-link polymers for a negative photoresist.

In other examples, instead of whole molecules making up the reactive gas being bound to a photoresist polymer, only a small part of a molecule making up the reactive gas is bound to the photoresist polymer to chemically induce cross-linking. In the alternative, the reactive gas may act such that none of the reactive gas is incorporated into the photoresist layer, but that the reactive gas induces a polymer cross-linking reaction, as a catalyst or as an active reagent.

The addition of molecules to the polymer chain and the removal of molecules, may induce undesirable swelling or shrinkage of the patterned photoresist layer. If much more is added to the photoresist layer than is cleaved, swelling may occur. Likewise, if much more is cleaved than added, shrinkage may occur. Therefore, it may be desirable to provide a reactive gas that is a mixture of gases where one type of gas may add more material to the photoresist than is cleaved and another gas cleaves more material than is added. A proper proportion of the mixture of these two gases may allow is the amount of material added to the photoresist layer to be almost equal to the amount removed. In the alternative, to reduce shrinkage a reactive gas with a larger molecular structure may be used. To reduce swelling, a reactive gas with a smaller molecular structure may be used.

It is believed that at least the surface of the patterned photoresist is chemically cross-linked by the reactive gas. It is also believed that, since the photoresist material is porous, the reactive gas may also be able to chemically induce cross-linking within the volume of the patterned photoresist material. The cross-linking may occur throughout the bulk of the photoresist layer or in the top 10% or 20% of the volume of the photoresist layer. It is believed that surface cross-linking, bulk cross-linking, or any intermediate result would have beneficial effects on the etch and ion implantation properties of the patterned photoresist It is believed that the inventive chemical cross-linking will significantly improve photoresist etch selectivity, such that the etch rate of the patterned photoresist film is decreased relative to the etch rate of the film to be etched. Since the maximum photoresist thickness is typically defined by the requirements of photolithography, improved etch selectivity allows the use of a thicker film into which the pattern is etched, and thereby relaxes the design constraints on the devices. It is also believed that the inventive chemical cross-linking also helps to reduce the release of functional groups from the bulk of the photoresist layer during plasma processing, as well as release of photoresist etch byproducts, thereby reducing adverse effects on plasma chemistry, substrate selectivity, and target film etch rate. The reduction of released functional groups and etch byproducts may be especially desirable for 193 nm photoresist, since this photoresist has been found to produce much more hydrogen than earlier generations of photoresist, and this shift in the plasma chemistry has been linked to shifts in dielectric etch process results. The inventive treated photoresist pattern may reduce pattern transfer damage and shrinkage. For ion implantation, the inventive patterned photoresist may allow the wafer to be heated to a higher temperature during ion implantation, which allows a higher ion flux, which in turn allows a higher throughput.

By providing a photoresist pattern that is more resistant to damage, shrinkage, and etching and that provides less cleavable group material to the plasma, the treated patterned photoresist provides a wider pattern transfer processing window. This allows more flexibility in the etch process to achieve other goals, such as tighter control of critical dimensions, better control of feature profiles, reduced microloading, improved etch rate uniformity, and improved selectivity to the etch stop layer. This also allows more flexibility in the ion implant process to operate at higher ion fluxes and wafer temperatures and thereby improve wafer throughput. In addition, without polymer cross-linking for 193 nm photolithography, the problems typically associated with etching of 193 nm photoresist materials may prevent an easy transfer of the etch process from wafer patterned with 248 nm photolithography to wafers processed with 193 nm photolithography. The transfer from 248 nm photolithography to 193 nm photolithography may normally cause the process window to become smaller. The added flexibility described above helps to limit the decrease in the process window.

The chemical cross-linking caused by reactive gas may be promoted, when combined with wafer heating, wafer exposure to radiation, such as x-ray radiation, UV radiation, or visible radiation, wafer exposure to a beam of charged particles, and/or wafer exposure to plasma. Such a promotion may reduce processing time, improve control over shrinkage and swelling, and/or allow the use of less reactive feedstock gases, which may reduce gas handling costs and hazards. The invention provides true cross-linking, instead of merely the removal of cleavable groups.

The use of chemical cross-linking may provide a faster throughput. In addition, the equipment used in the inventive cross-linking may be similar to equipment currently used in chip fabrication, allowing for easier implementation using current or modified equipment.

The control system 368 in the preferred embodiment of the invention is a processing module, comprising a processor with random access memory, which is connected to and exchanges information with a larger computing system over a network.

Figure 6A:
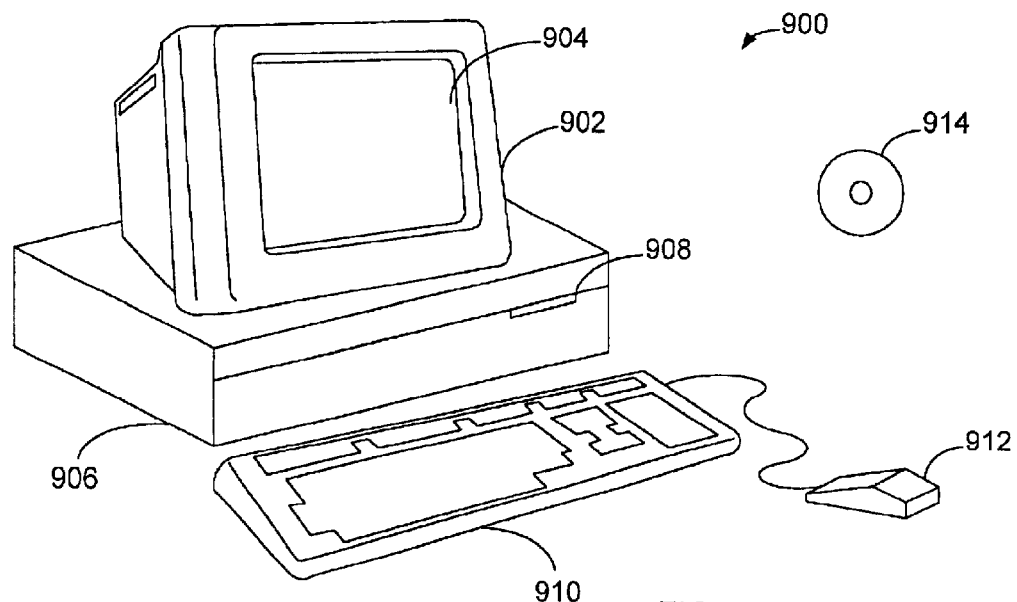
FIGS. 6A and 6B illustrate a computer system, which forms part of the network, and is suitable for providing a controller system.
Figure 6B:
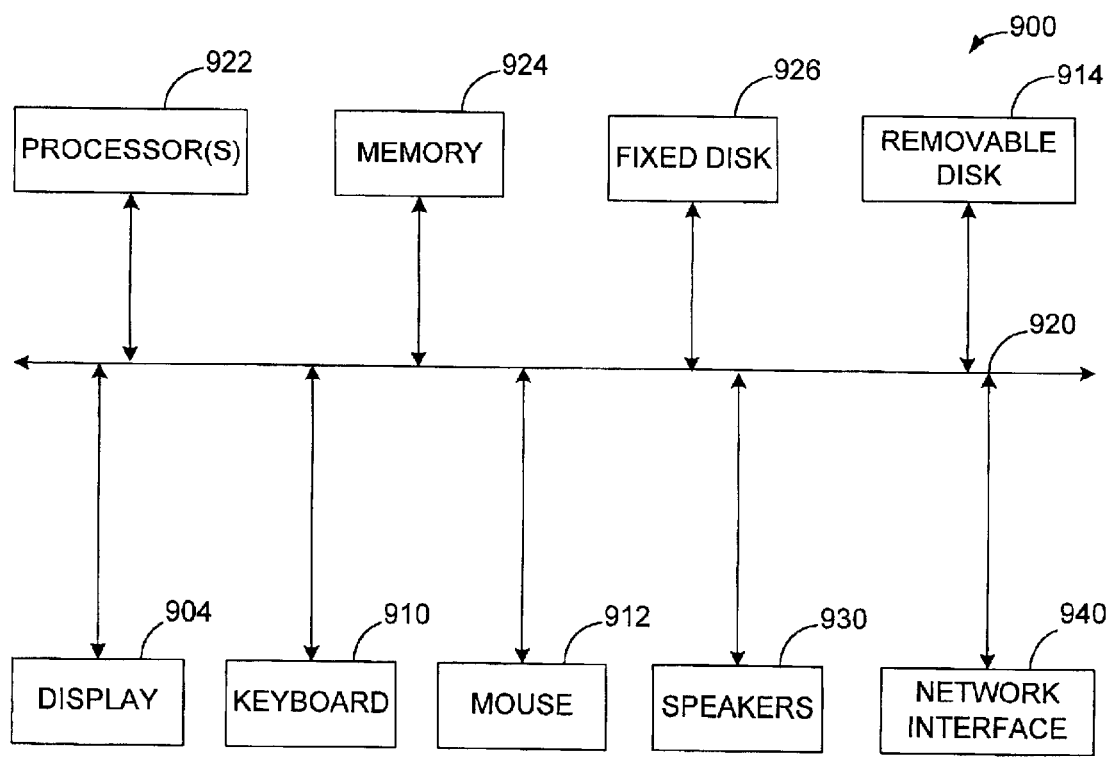

FIGS. 6A and 6B illustrate a computer system 900, which is suitable for implementing embodiments of the present invention. FIG. 6A shows one possible physical form of the computer system. Of course, the computer system may have many physical forms ranging from an integrated circuit, a printed circuit board, and a small handheld device up to a huge super computer. Computer system 900 includes a monitor 902, a display 904, a housing 906, a disk drive 908, a keyboard 910, and a mouse 912. Disk 914 is a computer-readable medium used to transfer data to and from computer system 900.

FIG. 6B is an example of a block diagram for computer system 900. Attached to system bus 920 are a wide variety of subsystems. Processor(s) 922 (also referred to as central processing units, or CPUs) are coupled to storage devices, including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data, and the like and is typically a secondary storage medium (such as a hard disk) that is slower than primary storage. It will be appreciated that the information retained within fixed disk 926 may, in appropriate cases, be incorporated in standard fashion as virtual memory in memory 924. Removable disk 914 may take the form of any of the computer-readable media described below.

CPU 922 is also coupled to a variety of input/output devices, such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, and substitute equivalents which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for creating semiconductor devices, comprising:
    providing a photoresist layer on a wafer;
    patterning the photoresist layer;
    chemically cross-linking polymers in the patterned photoresist layer by exposure to at least one reactive chemical; and
    transferring the pattern in the photoresist layer.

2. The method, as recited in claim 1, wherein the at least one reactive chemical is a reactive gas.

3. The method, as recited in claim 2, wherein at least the top 10% of volume of the photoresist layer is cross-linked.

4. The method, as recited in claim 2, wherein the chemical cross-linking improves photoresist etch selectivity without shrinkage.

5. The method, as recited in claim 2, wherein the photoresist layer is a photoresist material selected from the group comprising of Poly(methyl methacrylate) derivatives and Cycloolefin Maleic Anhydride derivatives.

6. The method, as recited in claim 1, wherein the patterning the photoresist layer comprises exposing regions of the photoresist layer with a light that has a wavelength that is less than 248 nm and removing regions of the photoresist layer.

7. The method, as recited in claim 6, wherein the patterning the photoresist layer further comprises baking the photoresist film to promote a deprotection reaction.

8. The method, as recited in claim 1, wherein the patterning the photoresist layer comprises exposing regions of the photoresist layer with a light that has a wavelength no greater than 193 nm and removing regions of the photoresist layer.

9. The method, as recited in claim 8, wherein the chemically cross-linking polymers, further comprises heating the wafer.

10. The method, as recited in claim 9, wherein transferring the pattern comprises etching the wafer.

11. The method, as recited in claim 9, wherein the transferring the pattern comprises implanting ions into the wafer.

12. The method, as recited in claim 1, wherein the reactive chemical is a reactive diamine gas.

13. A method for creating semiconductor devices, comprising:
    providing a photoresist layer on a wafer;
    patterning the photoresist layer, comprising:
        exposing regions of the photoresist layer with a light with a wavelength no greater than 193 nm; and removing regions of the photoresist layer;

cross-linking polymers in the patterned photoresist layer; and transferring the pattern in the photoresist layer to the wafer.

14. The method, as recited in claim 13, wherein the photoresist layer is a photoresist material selected from the group comprising of Poly(methyl methacrylate) derivatives and Cycloolefin Maleic Anhydride derivatives.

15. The method, as recited in claim 13, wherein the cross-linking polymers in the patterned photoresist layer, comprises exposing the patterned photoresist layer to at least one reactive chemical after regions have been removed from the photoresist layer to form the patterned photoresist layer.

16. The method, as recited in claim 15, wherein the reactive chemical is a reactive diamine gas.

17. The method, as recited in claim 13, wherein the patterning the photoresist layer further comprises baking the photoresist film to promote a deprotection reaction.

18. A method for creating semiconductor devices, comprising:

providing a photoresist layer on a wafer;

patterning the photoresist layer;

exposing regions of the photoresist layer with a light with a wavelength no greater than 193 nm; and removing regions of the photoresist layer;

heating the wafer chemically cross-linking polymers in the patterned photoresist layer by exposing the patterned photoresist layer to a reactive gas; and etching the pattern in the photoresist layer into the wafer.

* * * * *